(12) United States Patent
Reznicek et al.

(10) Patent No.: US 10,916,552 B2
(45) Date of Patent: Feb. 9, 2021

(54) STACKED FINFET MASK-PROGRAMMABLE READ ONLY MEMORY CONTAINING SPACED APART UPPER AND LOWER THRESHOLD VOLTAGE SETTING LAYERS

(71) Applicant: International Business Machines Corporation, Armonk, NY (US)

(72) Inventors: Alexander Reznicek, Troy, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/172,227

(22) Filed: Oct. 26, 2018

(65) Prior Publication Data

US 2020/0135747 A1 Apr. 30, 2020

(51) Int. Cl.
*H01L 27/11* (2006.01)
*H01L 27/112* (2006.01)
*H01L 27/088* (2006.01)

(52) U.S. Cl.
CPC .... *H01L 27/11253* (2013.01); *H01L 27/0886* (2013.01); *H01L 27/11206* (2013.01); *H01L 27/11246* (2013.01)

(58) Field of Classification Search
None
See application file for complete search history.

(56) References Cited

U.S. PATENT DOCUMENTS

| | | | |
|---|---|---|---|
| 9,496,268 B2 | 11/2016 | Liu et al. | |
| 9,627,270 B2 | 4/2017 | Cheng et al. | |
| 9,659,937 B2 | 5/2017 | Chang et al. | |
| 9,728,461 B2 | 8/2017 | Peng et al. | |
| 9,929,245 B2 | 3/2018 | Colinge et al. | |
| 10,084,090 B2 | 9/2018 | Cheng et al. | |
| 2016/0336421 A1* | 11/2016 | Cheng | H01L 21/8221 |
| 2017/0222045 A1* | 8/2017 | Leobandung | H01L 29/42376 |
| 2017/0229310 A1* | 8/2017 | Fung | H01L 21/3065 |

* cited by examiner

*Primary Examiner* — Bilkis Jahan
(74) *Attorney, Agent, or Firm* — Scully, Scott, Murphy & Presser, P.C.; Daniel P. Morris, Esq.

(57) ABSTRACT

A stacked FinFET mask-programmable read only memory (ROM) is provided. The stacked FinFET mask-programmable ROM includes a fin structure extending upward from an insulator layer. The fin structure includes, from bottom to top, a first semiconductor fin portion, an insulator fin portion, and a second semiconductor fin portion. A lower gate structure having a first threshold voltage contacts a sidewall of the first semiconductor fin portion, and an upper gate structure having a second threshold voltage contacts a sidewall of the second semiconductor fin portion.

12 Claims, 15 Drawing Sheets

STACKED FINFET MASK-PROGRAMMABLE READ ONLY MEMORY CONTAINING SPACED APART UPPER AND LOWER THRESHOLD VOLTAGE SETTING LAYERS

BACKGROUND

The present application relates to a semiconductor structure and a method of forming the same. More particularly, the present application relates to a stacked FinFET mask-programmable read only memory (ROM).

Monolithic three-dimensional (3D) integration is considered as an alternative approach to expensive extreme ultra-violet (EUV) lithography to continue density scaling. One scenario is to stack an n-type field effect transistor (nFET) and a p-type field effect transistor (pFET) on top of each other creating a stacked FinFET structure.

Stacked FinFET structures also need memory cells. Floating gate memory cells, which form the basis of non-volatile memory such as, for example, flash, programmable read only memory (PROM), erasable programmable read only memory (EPROM) and electrically erasable read only memory (EEPROM), are critical to the implementation of any technology. Existing methods to co-integrate non-volatile memories with stacked FinFET include complex processing steps. There is thus a need to co-integrate non-volatile memories with a stacked FinFET using a simply process in order to enable stacked FinFET circuits.

SUMMARY

A stacked FinFET mask-programmable read only memory (ROM) is provided. The term "mask-programmable read only memory (ROM)" denotes a non-volatile memory in which the data is programmed into the structure during manufacturing, so it is typically used for large production runs; a mask-programmable ROM cannot be rewritten with new data.

In one aspect of the present application, a stacked FinFET mask-programmable ROM is provided. In one embodiment, the stacked FinFET mask-programmable ROM includes a fin structure extending upward from an insulator layer. The fin structure includes, from bottom to top, a first semiconductor fin portion, an insulator fin portion, and a second semiconductor fin portion. A lower gate structure having a first threshold voltage contacts a sidewall of the first semiconductor fin portion, and an upper gate structure having a second threshold voltage contacts a sidewall of the second semiconductor fin portion.

In one embodiment, the first and second threshold voltages are the same. In such an embodiment, the first semiconductor fin portion and the second semiconductor fin portion are both programmed as "0" or "1", and the lower and upper gate structures include a same work function metal containing material or work function metal containing materials that provide a same work function value.

In another embodiment, the first and second threshold voltages are different. In such an embodiment, the first semiconductor fin portion is programmed as "0", and the second semiconductor fin portion is programmed as "1". Alternatively, and in such an embodiment, the first semiconductor fin portion is programmed as "1", and the second semiconductor fin portion is programmed as "0". In either instance, the lower gate structure comprises a first work function metal containing material, and the upper gate structure comprises a second work function metal containing material that is compositionally different from the first work function metal containing material.

In another aspect of the present, a stacked FinFET mask-programmable ROM array is provided. In one embodiment, the array includes a first stacked FinFET mask-programmable ROM memory that includes a first fin structure extending upward from an insulator layer. The first fin structure includes, from bottom to top, a first semiconductor fin portion, an insulator fin portion, and a second semiconductor fin portion. A lower gate structure having a first threshold voltage contacts a sidewall of the first semiconductor fin portion of the first fin structure, and an upper gate structure having the first threshold voltage contacts a sidewall of the second semiconductor fin portion of the first fin structure.

The array further includes a second stacked FinFET mask-programmable ROM memory that includes a second fin structure extending upward from the insulator layer. The second fin structure includes, from bottom to top, a first semiconductor fin portion, an insulator fin portion, and a second semiconductor fin portion. A lower gate structure having a second threshold voltage that is different from the first threshold voltage contacts a sidewall of the first semiconductor fin portion of the second fin structure, and an upper gate structure having the first threshold voltage contacts a sidewall of the second semiconductor fin portion of the second fin structure.

The array even further includes a third stacked FinFET mask-programmable ROM memory that includes a third fin structure extending upward from the insulator layer. The third fin structure includes, from bottom to top, a first semiconductor fin portion, an insulator fin portion, and a second semiconductor fin portion. A lower gate structure having the first threshold voltage contacts a sidewall of the first semiconductor fin portion of the third fin structure, and an upper gate structure having the second threshold voltage contacts a sidewall of the second semiconductor fin portion of the third fin structure.

The array yet further includes a fourth stacked FinFET mask-programmable ROM memory that includes a fourth fin structure extending upward from the insulator layer. The fourth fin structure includes, from bottom to top, a first semiconductor fin portion, an insulator fin portion, and a second semiconductor fin portion. A lower gate structure having the second threshold voltage contacts a sidewall of the first semiconductor fin portion of the fourth fin structure, and an upper gate structure having the second threshold voltage contacts a sidewall of the second semiconductor fin portion of the fourth fin structure.

In yet other aspect of the present application, a method of forming a stacked FinFET mask-programmable ROM is provided. In one embodiment, the method includes forming a fin structure extending upward from an insulator layer, wherein the fin structure includes, from bottom to top, a first semiconductor fin portion, an insulator fin portion, and a second semiconductor fin portion. A lower gate structure having a first threshold voltage is formed contacting a sidewall of the first semiconductor fin portion, and an upper gate structure having a second threshold voltage is formed contacting a sidewall of the second semiconductor fin portion. The lower gate structure and the upper gate structure are stacked one atop the other.

DETAILED DESCRIPTION

Figure 1:
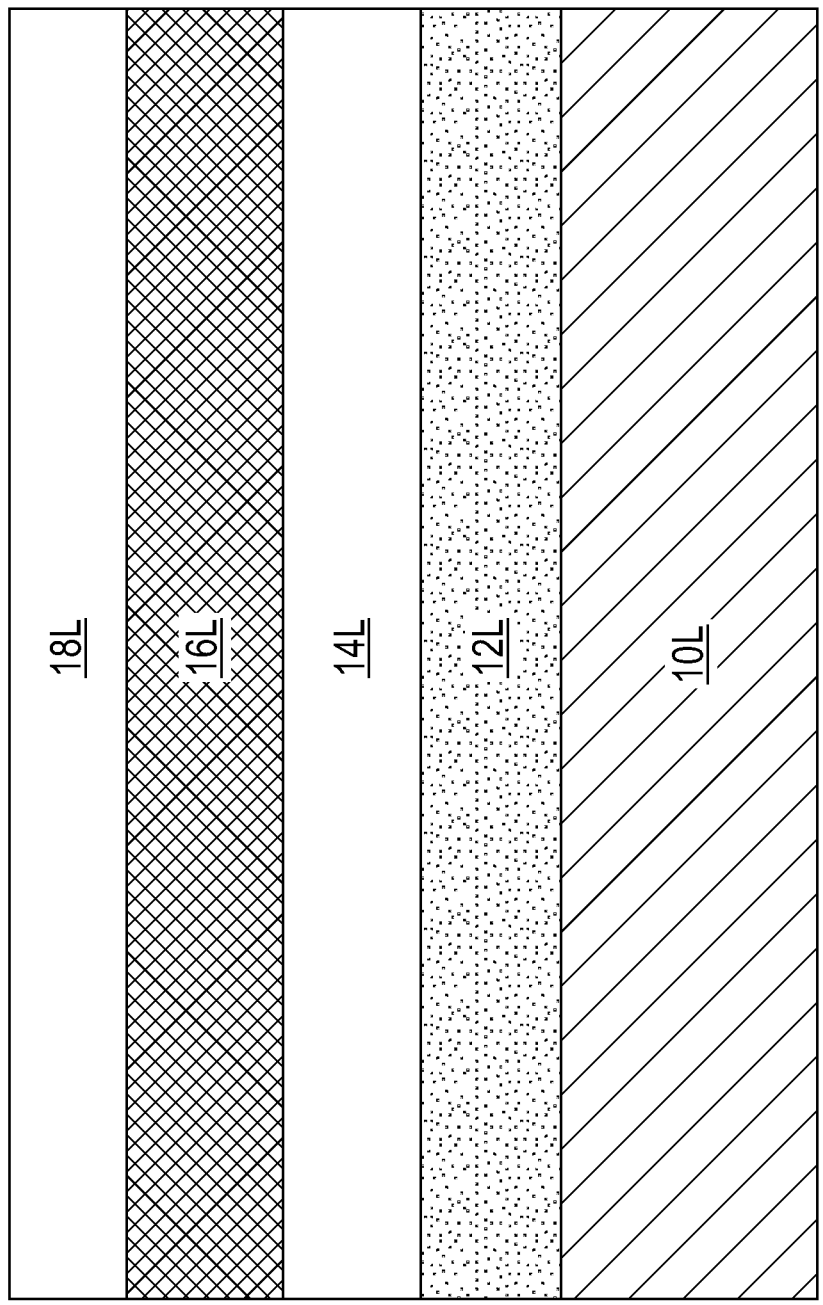
FIG. 1 is a cross sectional view of an exemplary semiconductor structure including a semiconductor substrate, a first insulator layer, a first semiconductor material layer, a second insulator layer, and second semiconductor material layer that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in the present application. The exemplary semiconductor structure of FIG. 1 includes, a semiconductor substrate 10L, a first insulator layer 12L, a first semiconductor material layer 14L, a second insulator layer 16L, and a second semiconductor material layer 18L.

Semiconductor substrate 10L includes at least one semiconductor material having semiconducting properties. Examples of semiconductor materials that provide the semiconductor substrate 10L include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10L can be a single crystalline semiconductor material. The semiconductor substrate 10L can have any of the well known crystal orientations. For example, the crystal orientation of the semiconductor substrate 10L may be {100}, {110}, or {111}. Other crystallographic orientations besides those specifically mentioned can also be used in the present application.

The first insulator layer 12L, which is located on a physically exposed surface of the semiconductor substrate 10L, may include a crystalline or non-crystalline dielectric material. In one example, the first insulator layer 12L may be composed of silicon dioxide and/or boron nitride. The first insulator layer 12L may have a thickness from 20 nm to 100 nm. Other thicknesses that are less than 20 nm and greater than 100 nm can also be used as the thickness of the first insulator layer 12L.

The first semiconductor material layer 14L, which is located on a physically exposed surface of the first insulator layer 12L, is composed of one of the semiconductor materials mentioned above for the semiconductor substrate 10L. In one embodiment, the first semiconductor material layer 14L is composed of a same semiconductor material as the semiconductor substrate 10L. In another embodiment, the first semiconductor material layer 14L may be composed of a different semiconductor material than the semiconductor substrate 10L. The first semiconductor material layer 14L may have a thickness from 50 nm to 250 nm. Other thicknesses that are less than 50 nm and greater than 250 nm can also be used as the thickness of the first semiconductor material layer 14L.

The second insulator layer 16L, which is located on a physically exposed surface of the first semiconductor material 14L, may include a crystalline or non-crystalline dielectric material. The dielectric material that provides the second insulator layer 16L may be the same as, or different from, the dielectric material that provides the first insulator layer 12L. In one example, the second insulator layer 16L may be composed of silicon dioxide and/or boron nitride. The second insulator layer 16L may have a thickness within the thickness range mentioned above for the first insulator layer 12L.

The second semiconductor material layer 18L, which is located on a physically exposed surface of the second insulator layer 16L, is composed of one of the semiconductor materials mentioned above for the semiconductor substrate 10L. In one embodiment, the second semiconductor material layer 18L is composed of a same semiconductor material as the semiconductor substrate 10L. In another embodiment, the second semiconductor material layer 18L may be composed of a different semiconductor material than the semiconductor substrate 10L. The semiconductor material that provides the second semiconductor material layer 18L may be the same as, or different from, the semiconductor material that provides the first semiconductor material layer 14L. The second semiconductor material layer 18L may have a thickness within the thickness range mentioned above for the first semiconductor material layer 14L.

The exemplary semiconductor structure of FIG. 1 can be formed utilizing any conventional process. In one embodiment, the exemplary semiconductor structure of FIG. 1 can be formed by first providing, and in any order, a semiconductor-on-insulator (SOI) substrate that includes the semiconductor substrate 10L, the first insulator layer 12L, and the first semiconductor material layer 14L, and a semiconductor wafer that includes a handle substrate (not shown), the second semiconductor material layer 18L and the second insulator layer 16L. A wafer bonding process is then used to bond the first semiconductor material layer 14L of the SOI substrate to the second insulator layer 16L of the semiconductor wafer. After wafer bonding, the handle substrate is removed providing the exemplary semiconductor structure of FIG. 1.

Figure 2A:
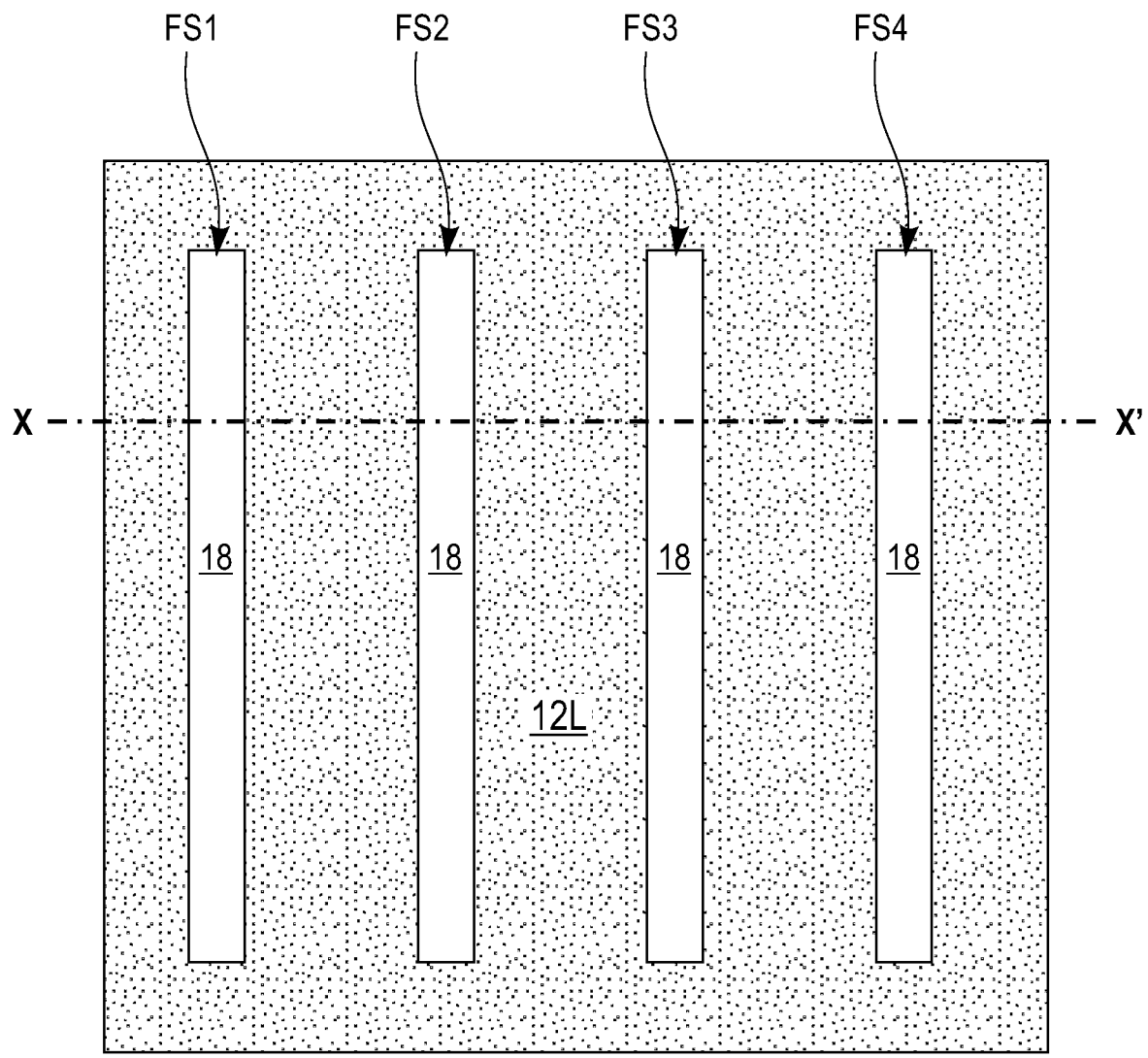
FIG. 2A is a top down view of the exemplary semiconductor structure of FIG. 1 after forming a plurality of fin structures extending upward from the first insulator layer, wherein each fin structure of the plurality of fin structures includes, from bottom to top, a first semiconductor fin portion, an insulator fin portion, and a second semiconductor fin portion.
Figure 2B:
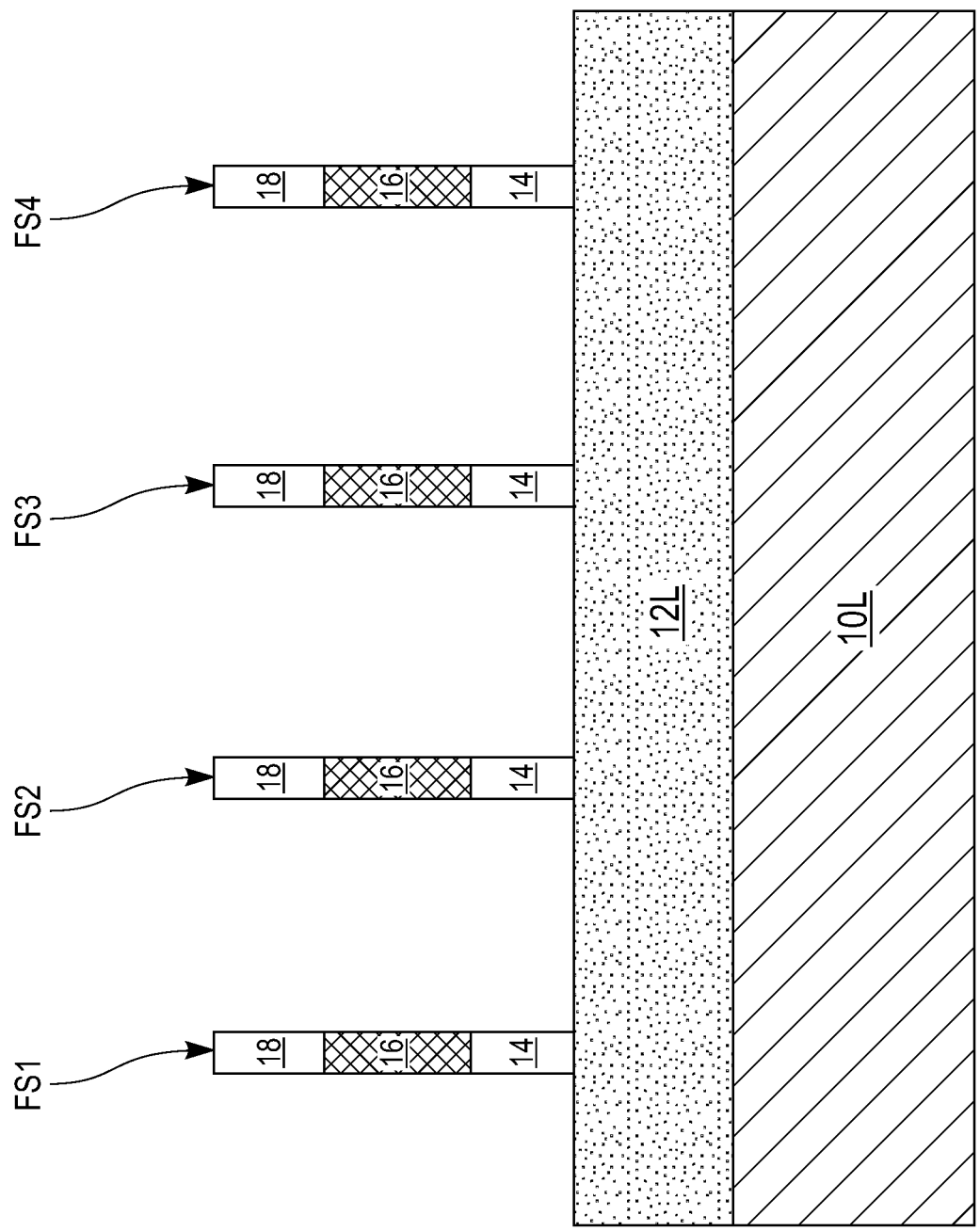
FIG. 2B is a cross sectional view of the exemplary semiconductor structure of FIG. 2A through line X-X'.

Referring now to FIGS. 2A-2B, there are illustrated the exemplary semiconductor structure of FIG. 1 after forming a plurality of fin structures (e.g., FS1, FS2, FS3, and FS4) extending upward from the first insulator layer 12L. FS1 denotes a first fin structure, FS2 denotes a second fin structure, FS3 denotes a third fin structure, and FS4 denotes a fourth fin structure. Although four fin structures are described and illustrated, the present application is not limited to forming four fin structures. Instead, the present application contemplates embodiments in which less than four fin structure or greater than four fin structures are formed.

Each fin structure (e.g., FS1, FS2, FS3, and FS4) of the plurality of fin structures includes, from bottom to top, a first semiconductor fin portion 14, an insulator fin portion 16, and a second semiconductor fin portion 18. The first semiconductor fin portion 14 is a non-etched portion of the first semiconductor material layer 14L, the insulator fin portion 16 is a non-etched portion of the second insulator layer 16L, and the second semiconductor fin portion 18 is a non-etched portion of the second semiconductor material layer 18L.

Each fin structure (e.g., FS1, FS2, FS3, and FS4) that is formed is orientated parallel to each other. Each fin structure (e.g., FS1, FS2, FS3, and FS4) has a same vertical height, width and length. Each fin structure (e.g., FS1, FS2, FS3, and FS4) will be processed to include a lower gate structure that contacts a sidewall of the first semiconductor fin portion 14 and an upper gate structure that contacts a sidewall of the second semiconductor fin portion 18. A portion of the lower gate structure may contact a lower portion of a sidewall of the insulator fin portion 16, and a portion of the upper gate structure may contact an upper portion of the sidewall of the insulator fin portion 16. The lower and upper gate structures will be stacked one atop the other.

The term "fin structure" is used in the present application to define a structure that is composed of first and second semiconductor materials that are vertically separated from each other by an insulator material, and including a pair of vertical sidewalls that are parallel to each other. A surface is "vertical" if there exists a vertical plane from which the surface does not deviate by more than three times the root mean square roughness of the surface. In one embodiment, each fin structure (e.g., FS1, FS2, FS3, and FS4) has a vertical height from 20 nm to 300 nm, a width from 5 nm to 30 nm, and a length from 20 nm to 300 nm. Other vertical heights and/or widths and/or lengths that are lesser than, or greater than, the ranges mentioned herein can also be used in the present application.

The plurality of fin structures (e.g., FS1, FS2, FS3, and FS4) can be formed by patterning the second semiconductor material layer 18L, the second insulator layer 16L and the first semiconductor material layer 14L of the exemplary structure shown in FIG. 1; the patterning stops on a topmost surface of the first insulator layer 12L. Patterning may be performed by lithography and etching, a sidewall image transfer (SIT) process or by a direct self-assembly (DSA) process in which a copolymer that is capable of direct self-assembly is used. Such patterning processes are well known to those skilled in the art therefore the details of each of the aforementioned patterning processes has be omitted so as not to obscure the method of the present application.

Figure 3:
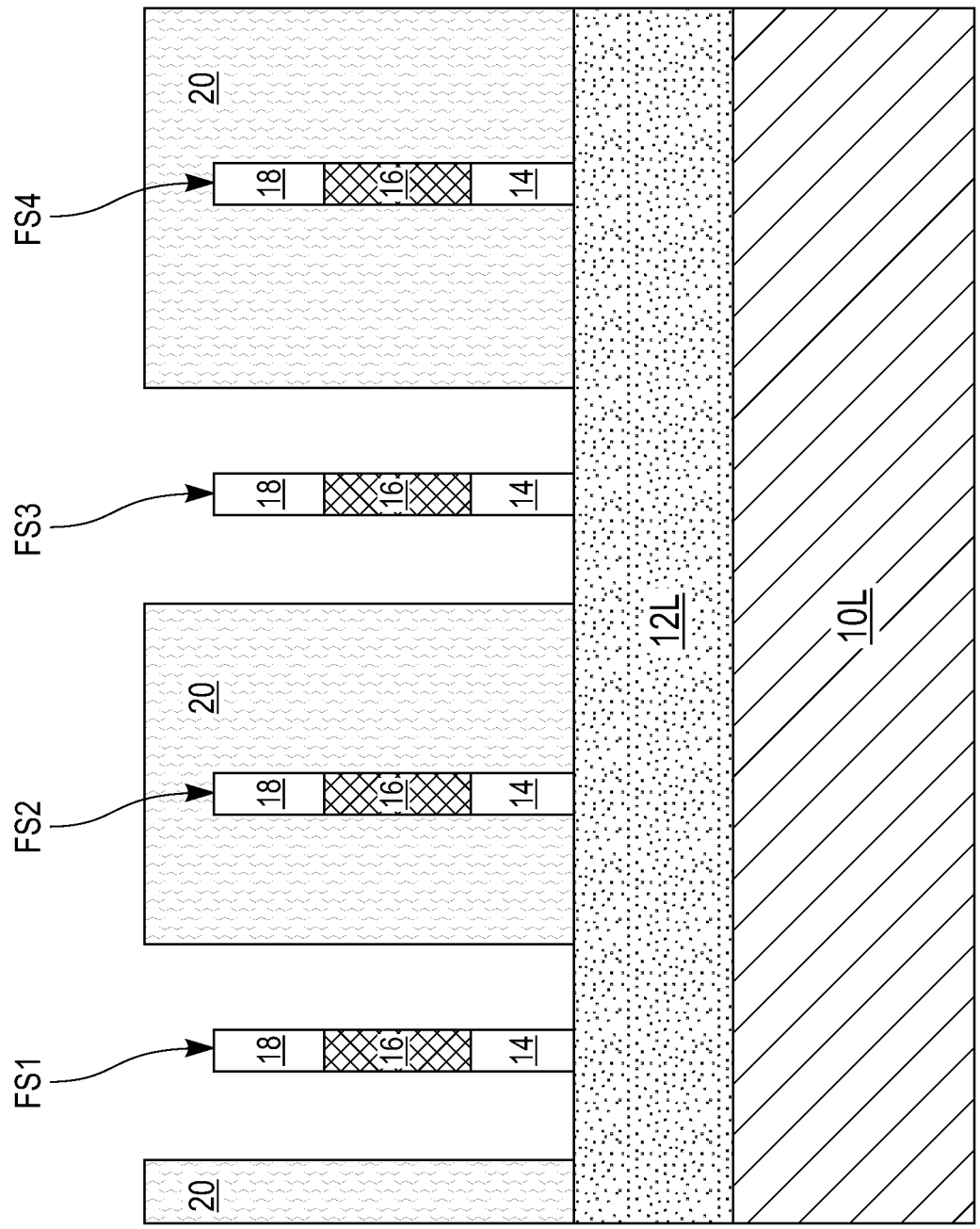
FIG. 3 is a cross sectional view of the exemplary semiconductor structure of FIGS. 2A-2B after forming a first patterned interlayer dielectric (ILD) material which contains openings which physically expose a first set of fin structures of the plurality fin structures.

Referring now to FIG. 3, there is illustrated the exemplary semiconductor structure of FIGS. 2A-2B after forming a first patterned interlayer dielectric (ILD) material 20 which contains openings which physically expose a first set of fin structures of the plurality fin structures. In one embodiment and as is illustrated in FIG. 3, the first fin structure FS1 and the third fin structure FS3 are physically exposed, while the second fin structure FS2 and the fourth fin structure FS4 are protected, i.e., covered, by the first patterned ILD material 20.

The first patterned ILD material 20 can be formed by first providing a layer of a first ILD material to the exemplary semiconductor structure shown in FIGS. 2A-2B, and thereafter the layer of first ILD material is lithographically patterned to include the openings that physically exposed a first set of fin structures of the plurality of fin structures. Lithographic patterning includes applying a photoresist material to a material or material stack that needs to be patterned, exposing the photoresist material to a pattern of irradiation and developing the exposed photoresist material. The layer of the first ILD material, which is formed in the space, i.e., gap, between each of the fin structures and atop each of fin structures, is composed of a dielectric material that is compositionally different from the dielectric material of the first and second insulator layers 12L and 16L. Examples of dielectric materials that can be used as the first ILD material in the present application include undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In one embodiment, the layer of the first ILD material can be formed by a deposition process such as, for example, chemical vapor deposition (CVD), plasma enhanced chemical vapor deposition (PECVD), evaporation or spin-on coating.

Figure 4:
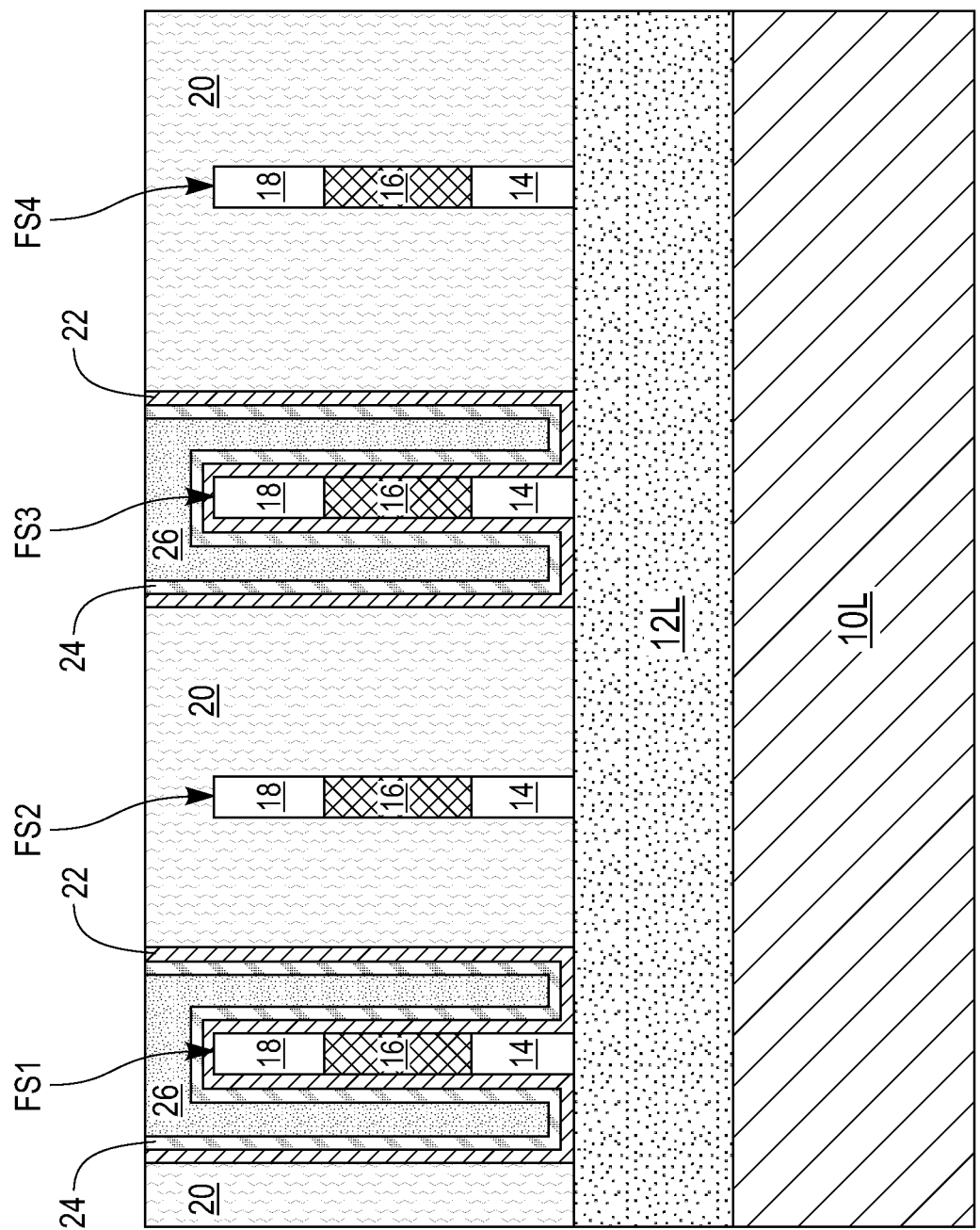
FIG. 4 is a cross sectional view of the exemplary semiconductor structure of FIG. 3 after forming a first gate structure having a first threshold voltage on physically exposed surfaces of each fin structure of the first set of fin structures.

Referring now to FIG. 4, there is illustrated the exemplary semiconductor structure of FIG. 3 after forming a first gate structure having a first threshold voltage on physically exposed surfaces of each fin structure (i.e., FS1 and FS3) of the first set of fin structures. The first gate structure includes a first gate dielectric material layer 22, a first work function setting layer 24, and a first gate electrode layer 26.

The first gate dielectric material layer 22 is composed of a gate dielectric material such as, for example, an oxide, nitride, and/or oxynitride. In one example, the first gate dielectric material layer 22 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first gate dielectric material layer 22. In one embodiment, the first gate dielectric material layer 22 can have a thickness in a range from 1 nm to 10 nm. Other thicknesses that are lesser than, or greater than, the aforementioned thickness range can also be employed for the first gate dielectric material layer 22.

The first work function setting layer 24 includes any suitable work function metal (WFM) containing material. Illustrative examples of WFM containing materials that can be employed as the first work function setting layer 24 include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof. In one embodiment, the first work function setting layer 24 may provide a threshold voltage to the first gate structure that is less than 0. In another embodiment, the first work function setting layer 24 may provide a threshold voltage to the first gate structure that is greater than 0. In one embodiment, the first work function setting layer 24 can have a thickness in a range from 20 nm to 50 nm. Other thicknesses that are lesser than, or greater than, the aforementioned thickness range can also be employed for the first work function setting layer 24.

There are two ways of implementing the threshold voltages—either Technique 1 or Technique 2, as follows, can be used in the present application:
1) "NOR" architecture:
    a. First threshold voltage is a normal voltage (enhancement mode device), or a low threshold voltage (0V to 0.4V, for example)—this programmed value is "1"
    b. Second threshold voltage is a high voltage (always-off device), higher than the supply voltage VDD (0.8V-1.2V, for example)—this programmed value is "0".
2) "NAND" architecture:
    a. First threshold voltage is a normal voltage (enhancement mode device), or a low threshold voltage (0V to 0.4V, for example)—this programmed value is "0"
    b. Second threshold voltage is a negative voltage (depletion-mode device), (−0.5V to −0.2V, for example)—this programmed value is "1".

The gate electrode layer 26 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition.

The first gate structure (22, 24, 26) can be formed by sequentially depositing the first gate dielectric material layer 22, the first work function setting layer 24, and the first gate electrode layer 26 into each of the openings provided in the first patterned ILD material. A planarization process such as, for example, chemical mechanical polishing (CMP) and/or grinding may follow the sequential deposition processes to remove any material from the topmost surface of the first patterned ILD material 20.

At this point of the present application, the first gate structure (22, 24, 26) is located on the entirety of the physically exposed portion of FS1 and FS3 including, along the sidewalls of the first semiconductor fin portion 14, the sidewall of the insulator fin portion 16, and the sidewalls and topmost surface of the second semiconductor fin portion 18.

Figure 5:
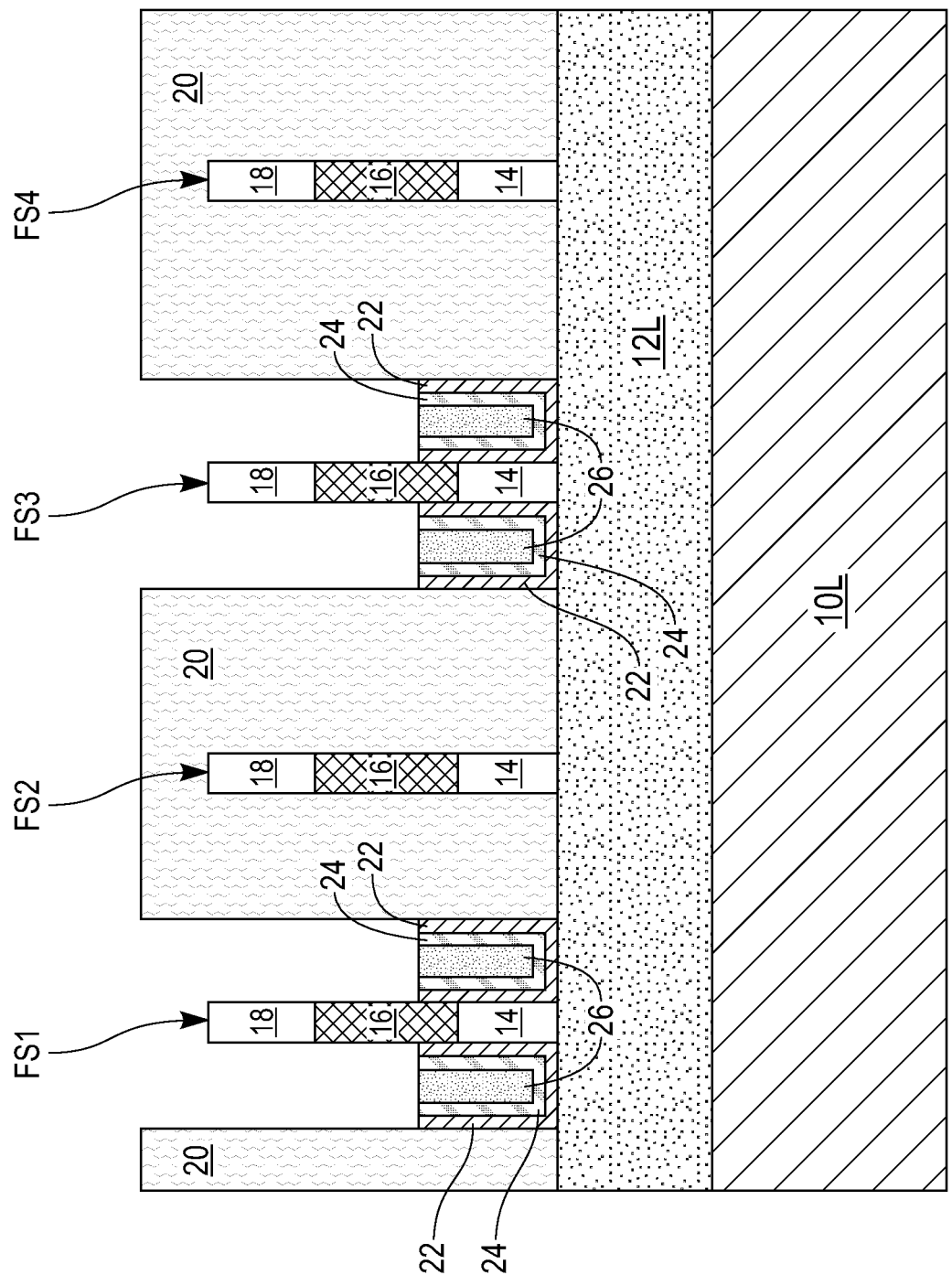
FIG. 5 is a cross sectional view of the exemplary semiconductor structure of FIG. 4 after removing the first gate structure from the second semiconductor fin portion of each fin structure of the first set of fin structures, while maintaining the first gate structure on the first semiconductor fin portion of each fin structure of the first set of fin structures.

Referring now to FIG. 5, there is illustrated the exemplary semiconductor structure of FIG. 4 after removing the first gate structure (22, 24, 26) from the second semiconductor fin portion 18 of each fin structure (i.e., FS1 and FS3) of the first set of fin structures, while maintaining the first gate structure (22, 24, 26) on the first semiconductor fin portion 14 of each fin structure (i.e., FS1 and FS3) of the first set of fin structures. As is illustrated, a portion of the first gate structure (22, 24, 26) may remain on a lower portion of the insulator fin portion 16.

The removal of the first gate structure (22, 24, 26) from the second semiconductor fin portion 18 of each fin structure (i.e., FS1 and FS3) of the first set of fin structures may be performed utilizing one or more recess etching processes which are selective in removing the first gate structure (22, 24, 26) from the second semiconductor fin portion 18 of each fin structure (i.e., FS1 and FS3) of the first set of fin structures.

Figure 6:
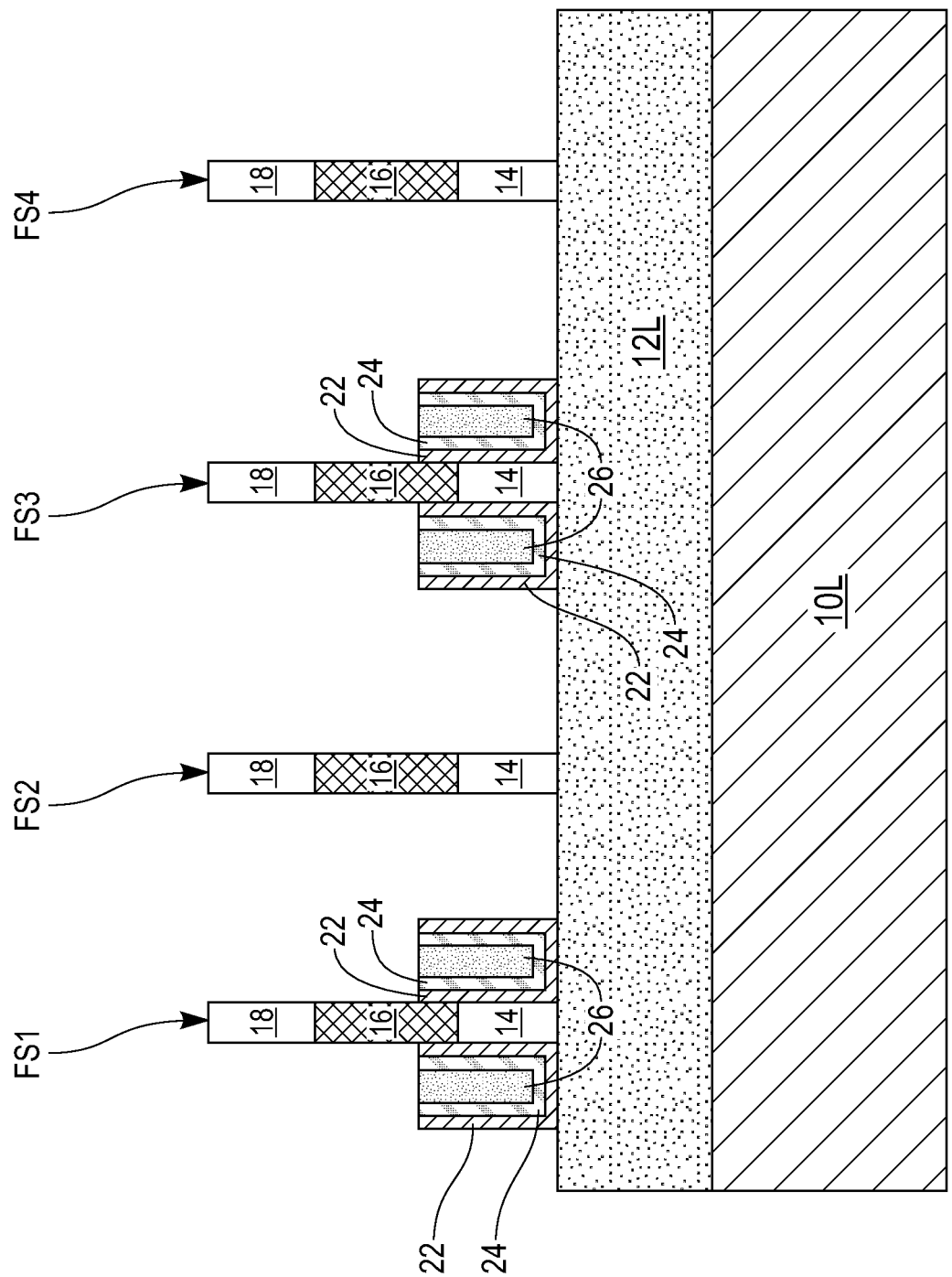
FIG. 6 is a cross sectional view of the exemplary semiconductor structure of FIG. 5 after removing the first patterned interlayer dielectric (ILD) material.

Referring now to FIG. 6, there is illustrated the exemplary semiconductor structure of FIG. 5 after removing the first patterned interlayer dielectric (ILD) material 20. The first patterned ILD material 20 may be removed utilizing an anisotropic etching process such as, for example, a reactive ion etch or a chemical wet etch.

Figure 7:
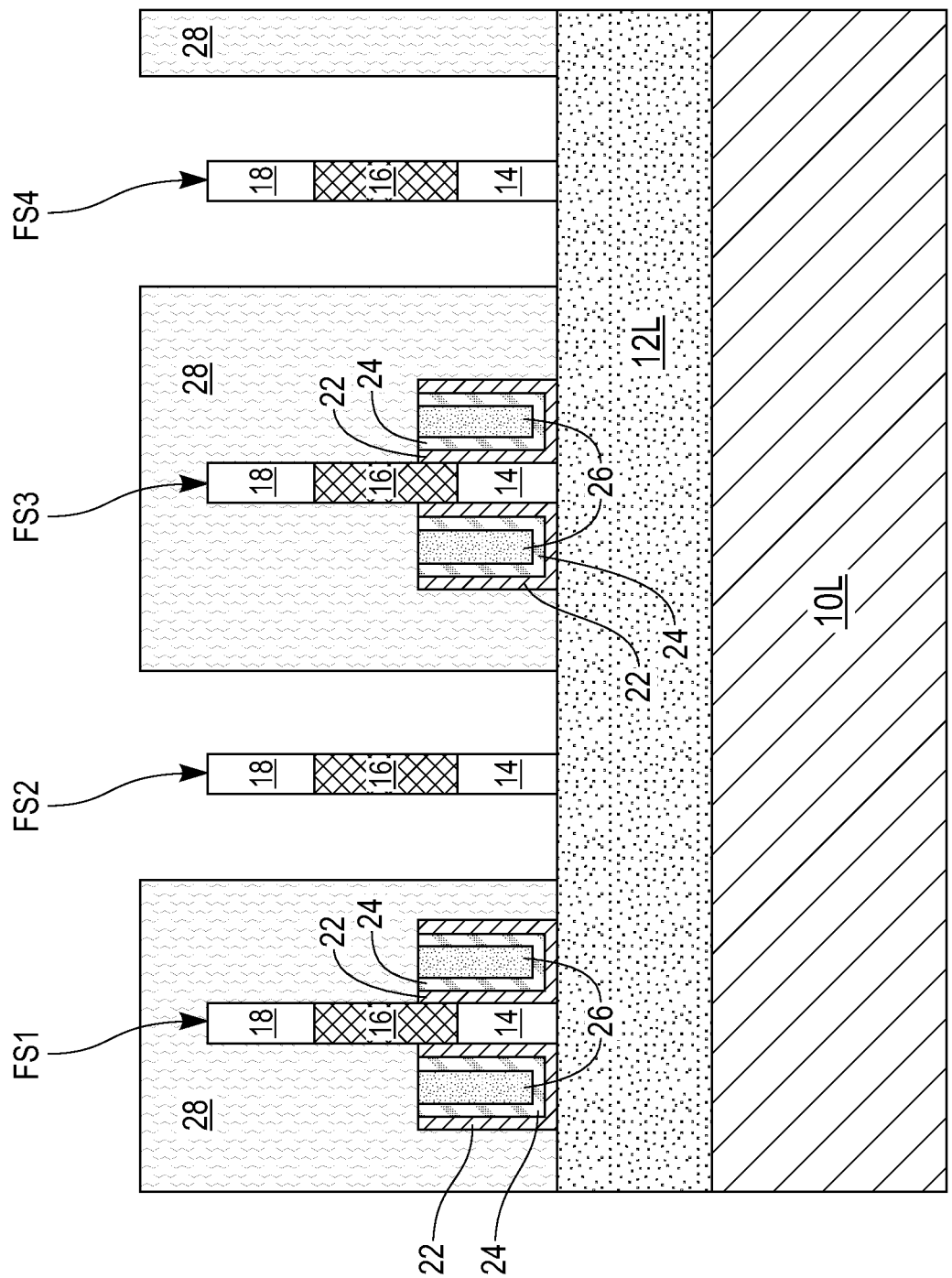
FIG. 7 is a cross sectional view of the exemplary semiconductor structure of FIG. 6 after forming a second patterned interlayer dielectric (ILD) material which contains openings which physically expose a second set of fin structures of the plurality fin structures.

Referring now to FIG. 7, there is illustrated the exemplary semiconductor structure of FIG. 6 after forming a second patterned interlayer dielectric (ILD) material 28 which contains openings which physically expose a second set of fin structures of the plurality fin structures. In one embodiment and as is illustrated in FIG. 7, the second fin structure FS2 and the fourth fin structure FS4 are physically exposed, while the first and third fin structures FS1 and FS3, respectively, and the first gate structure (22, 24, 26) are protected, i.e., covered, by the second patterned ILD material 28.

The second patterned ILD material 28 can be formed utilizing the technique mentioned above in forming the first patterned ILD material 20. The second patterned ILD material 28 may include one of the dielectric materials mentioned above for the first patterned ILD material 20. In one embodiment, the second patterned ILD material 28 is composed of a same dielectric material as that which provides the first patterned ILD material 20. In another embodiment, the dielectric material that provides the second patterned ILD material 28 is composed of a compositionally different dielectric material than that which provides the first patterned ILD material 20.

Figure 8:
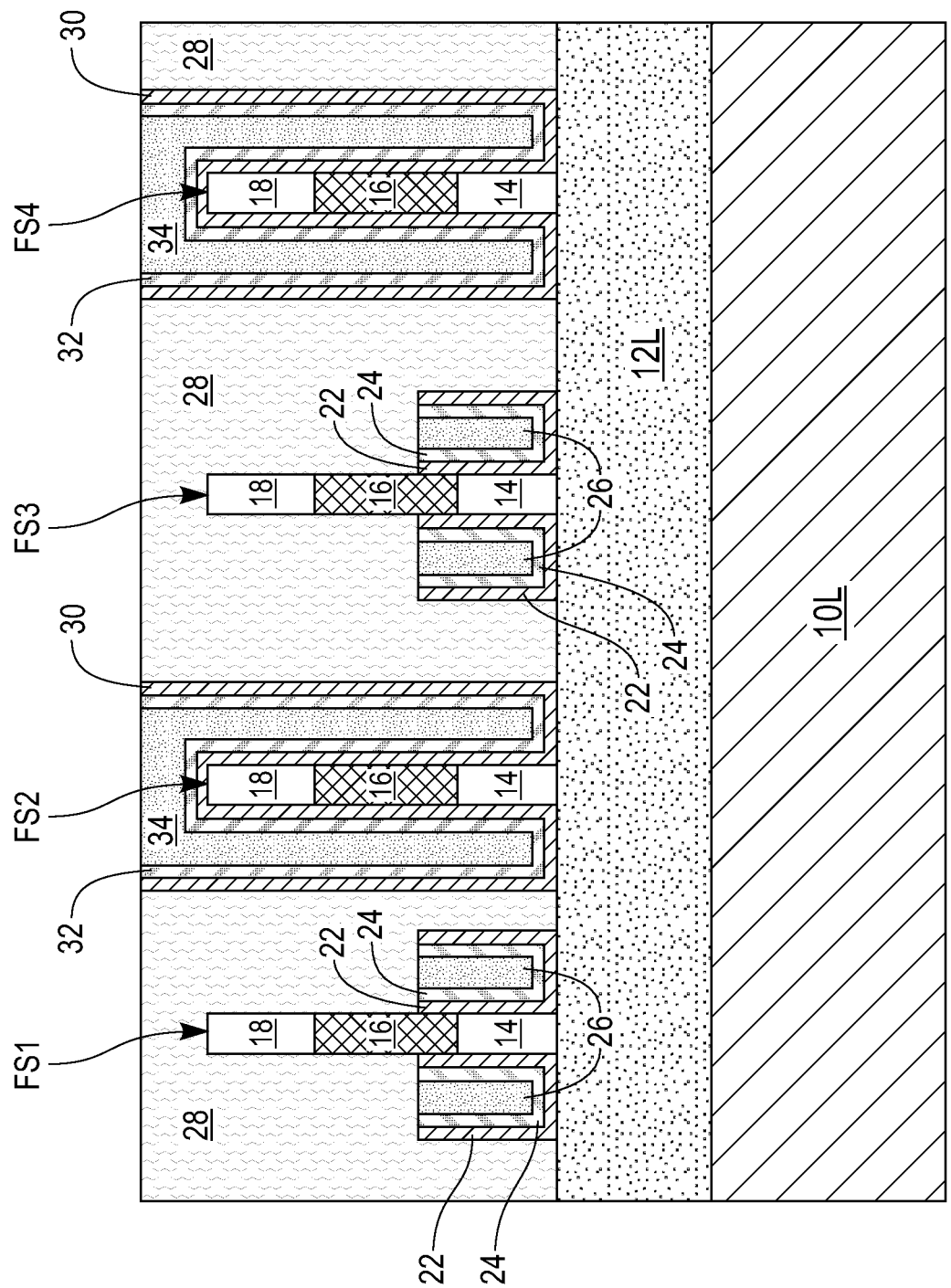
FIG. 8 is a cross sectional view of the exemplary semiconductor structure of FIG. 7 after forming a second gate structure having a second threshold voltage which differs from the first threshold voltage of the first gate structure on physically exposed surfaces of each fin structure of the second set of fin structures.

Referring now to FIG. 8, there is illustrated the exemplary semiconductor structure of FIG. 7 after forming a second gate structure having a second threshold voltage which differs from the first threshold voltage of the first gate structure (22, 24, 26) on physically exposed surfaces of each fin structure (i.e., FS2 and FS4) of the second set of fin structures. The second gate structure includes a second gate dielectric material layer 30, a second work function setting layer 32, and a second gate electrode layer 34.

The second gate dielectric material layer 30 may include one of the gate dielectric materials mentioned above for the first gate dielectric material layer 22. In one embodiment, the second gate dielectric material layer 30 is composed of a same gate dielectric material as the first gate dielectric material layer 22. In another embodiment, the second gate dielectric material layer 30 is composed of a compositionally different gate dielectric material than the first gate dielectric material layer 22. The second gate dielectric material layer 30 may have a thickness within the range mentioned above for the first gate dielectric material layer 22.

The second work function setting layer 32 may be selected from one of the work function metal containing materials mentioned above for the first work function setting layer 24 provided that the second work function setting layer 32 is compositionally different from the first work function setting layer 24 such that the second work function setting layer 32 provides a different threshold voltage to the second gate structure (30, 32, 34). In one embodiment, the second work function setting layer 34 may provide a threshold voltage to the second gate structure that is less than 0. In another embodiment, the second work function setting layer 32 may provide a threshold voltage to the second gate structure that is greater than 0. In either embodiment, the second threshold voltage must be different from the first threshold voltage.

The second gate electrode layer 34 may include one of the conductive materials mentioned above for the first gate electrode layer 26. In one embodiment, the second gate electrode layer 34 is composed of a same conductive material as the first electrode layer 26. In another embodiment, the second gate electrode layer 34 is composed of a compositionally different conductive material than the first gate electrode layer 26.

The second gate structure (30, 32, 34) can be formed utilizing the technique mentioned above in forming the first gate structure (22, 24, 26).

Figure 9:
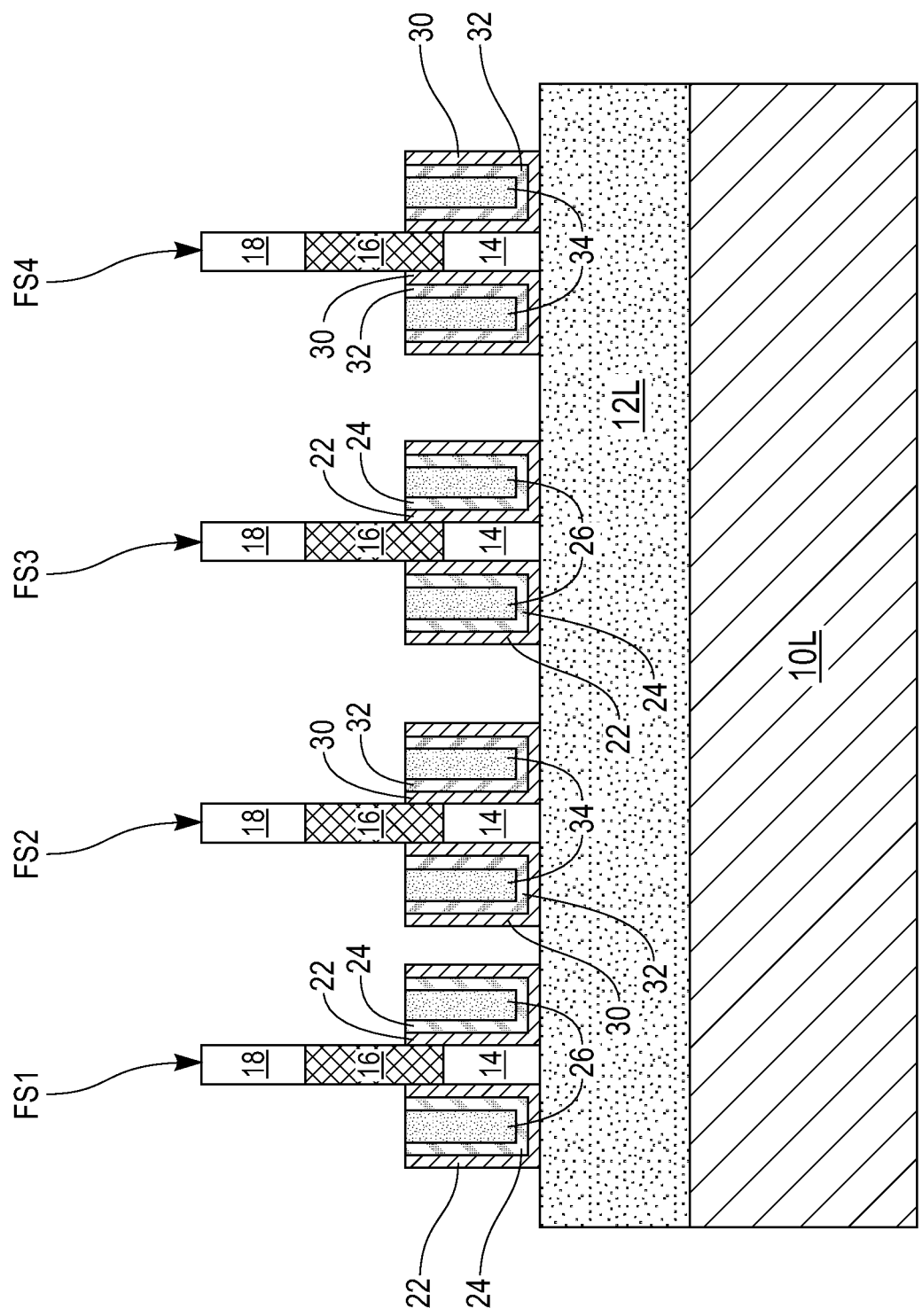
FIG. 9 is a cross sectional view of the exemplary semiconductor structure of FIG. 8 after removing the second gate structure from the second semiconductor fin portion of each fin structure of the second set of fin structures, while maintaining the second gate structure on the first semiconductor fin portion of each fin structure of the second set of fin structures, and removing the second patterned interlayer dielectric (ILD) material.

Referring now to FIG. 9, there is illustrated the exemplary semiconductor structure of FIG. 8 after removing the second gate structure (30, 32, 34) from the second semiconductor fin portion 18 of each fin structure (i.e., FS2 and FS4) of the second set of fin structures, while maintaining the second gate structure (30, 32, 34) on the first semiconductor fin portion 14 of each fin structure (i.e., FS2 and FS4) of the second set of fin structures, and removing the second patterned interlayer dielectric (ILD) material 28.

After the removal of the second gate structure (30, 32, 34) from the second semiconductor fin portion 18 of each fin structure (i.e., FS2 and FS4) of the second set of fin structures, a portion of the second gate structure (30, 32, 24) may remain on a lower portion of the insulator fin portion 16.

The removal of the second gate structure (30, 32, 34) from the second semiconductor fin portion 18 of each fin structure (i.e., FS2 and FS4) of the second set of fin structures may be performed utilizing one or more recess etching process which is(are) selective in removing the second gate structure (30, 32, 34) from the second semiconductor fin portion 18 of each fin structure (i.e., FS2 and FS4) of the second set of fin structures. The second patterned ILD material 28 may be removed utilizing an anisotropic etching process such as, for example, a reactive ion etch or a chemical wet etch.

Figure 10:
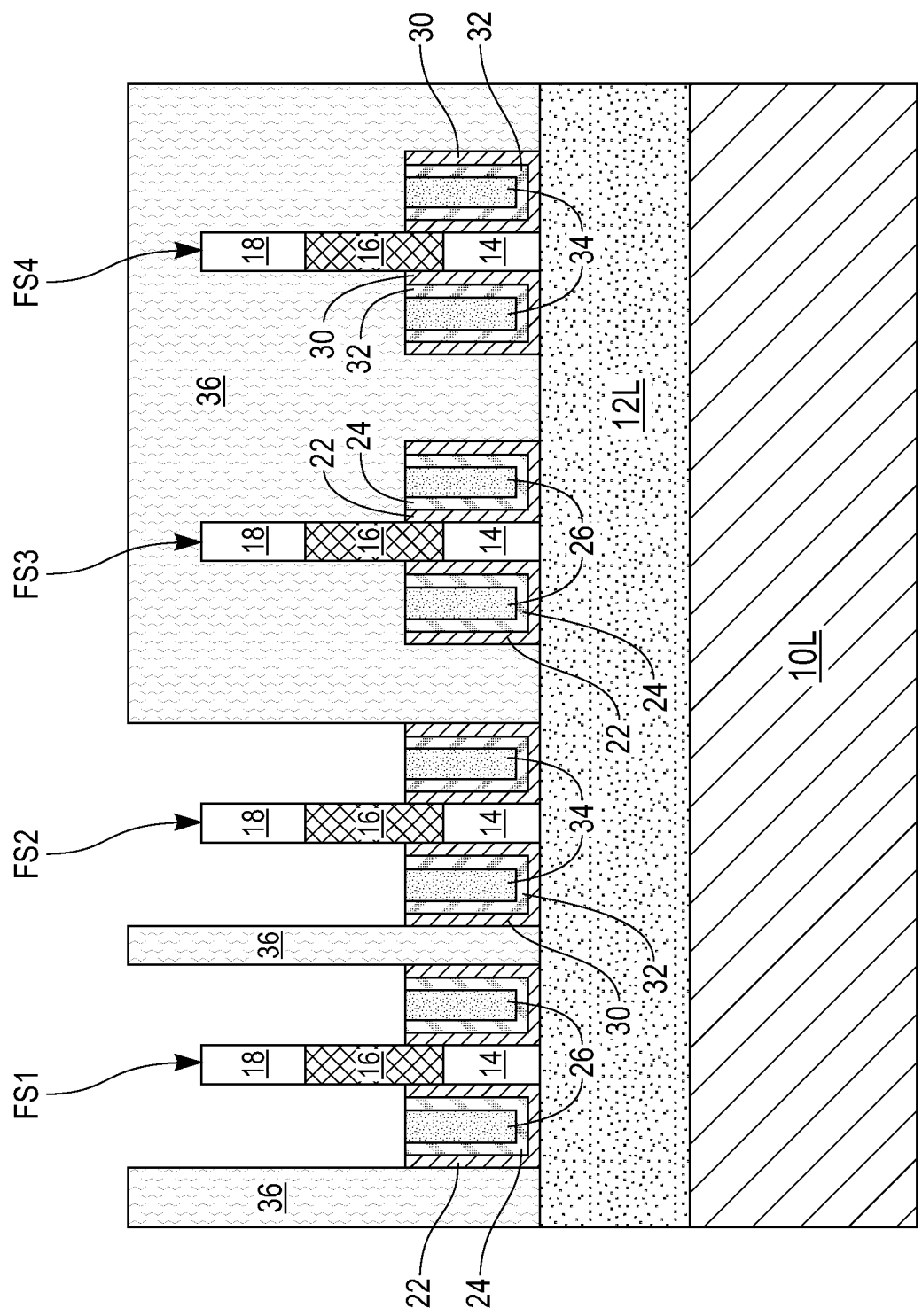
FIG. 10 is a cross sectional view of the exemplary semiconductor structure of FIG. 9 after forming a third patterned interlayer dielectric (ILD) material which contains openings which physically expose a fin structure from the first set of fin structures, and a fin structure from the second set of fin structures.

Referring now to FIG. 10, there is illustrated the exemplary semiconductor structure of FIG. 9 after forming a third patterned interlayer dielectric (ILD) material 36 which contains openings which physically expose a fin structure (i.e., FS1) from the first set of fin structures, and a fin structure (i.e., FS2) from the second set of fin structures.

In one embodiment and as is illustrated in FIG. 10, the first and second fin structure FS1 and FS2, respectively, are physically exposed, while the third fin structure FS3 (and the first gate structure (22, 26, 28)), and the fourth gate structure FS4 (and the second gate structure (30, 32, 34)) are protected, i.e., covered, by the third patterned ILD material 36.

The third patterned ILD material 36 can be formed utilizing the technique mentioned above in forming the first patterned ILD material 20. The third patterned ILD material 36 may include one of the dielectric materials mentioned above for the first patterned ILD material 20. In one embodiment, the third patterned ILD material 36 is composed of a same dielectric material as that which provides the first patterned ILD material 20. In another embodiment, the dielectric material that provides the third patterned ILD material 36 is composed of a compositionally different dielectric material than that which provides the first patterned ILD material 20.

Figure 11:
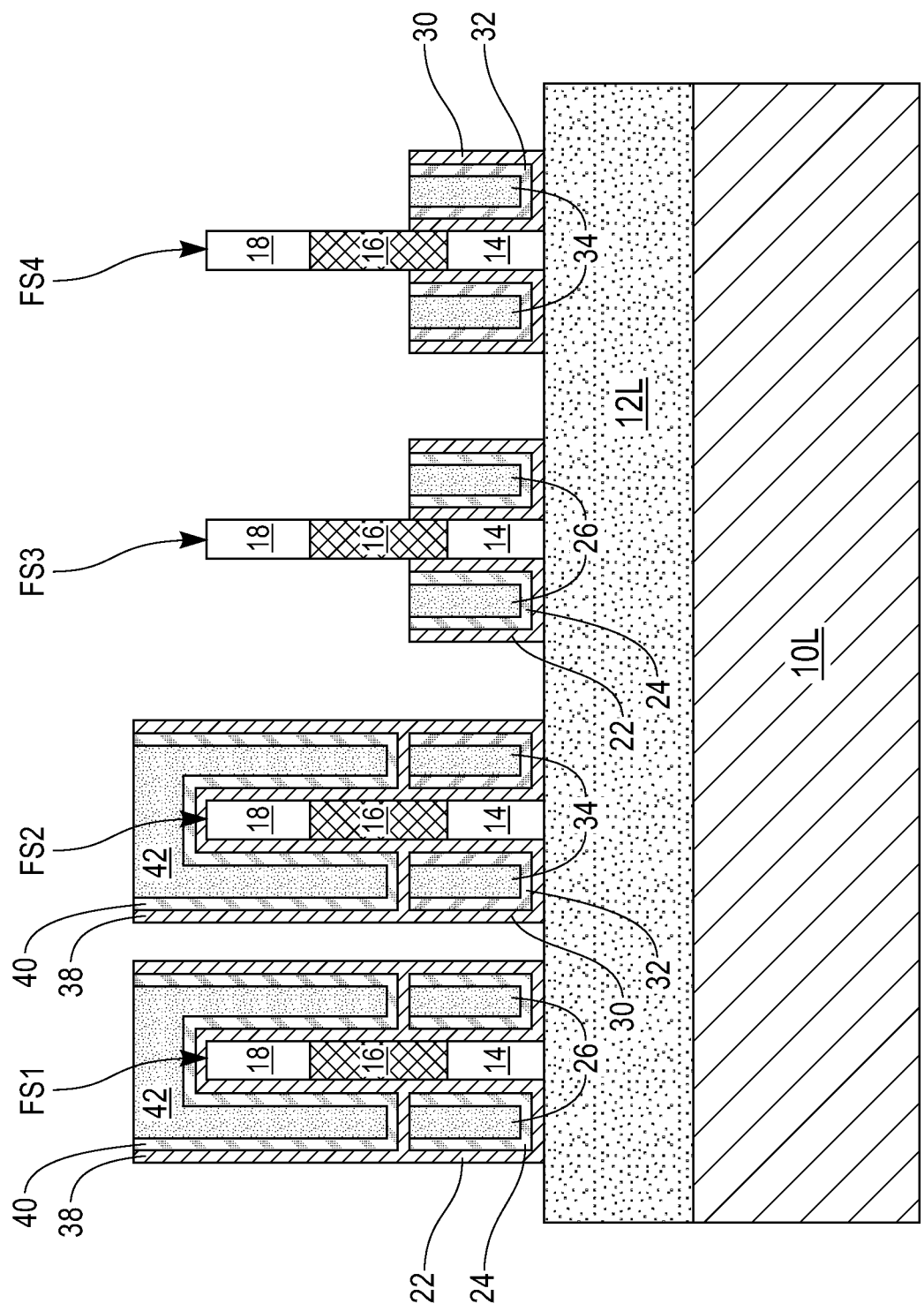
FIG. 11 is a cross sectional view of the exemplary structure of FIG. 10 after forming a third gate structure having the first threshold voltage on top of the first gate structure and on physically exposed surfaces of the fin structure from the first set of fin structures, and on top of the second gate structure and on physically exposed surfaces of the fin structure from the second set of fin structures, and removing the third patterned interlayer dielectric (ILD) material.

Referring now to FIG. 11, there is illustrated the exemplary structure of FIG. 10 after forming a third gate structure having the first threshold voltage on top of the first gate structure (22, 24, 26) and on physically exposed surfaces of the fin structure (i.e., FS1) from the first set of fin structures, and on top of the second gate structure (30, 32, 34) and on physically exposed surfaces of the fin structure (i.e., FS2) from the second set of fin structures, and removing the third patterned ILD material 36. The third gate structure includes a third gate dielectric material layer 38, a third work function setting layer 40, and a third gate electrode layer 42.

The third gate dielectric material layer 38 may include one of the gate dielectric materials mentioned above for the first gate dielectric material layer 22. In one embodiment, the third gate dielectric material layer 38 is composed of a same gate dielectric material as the first gate dielectric material layer 22. In another embodiment, the third gate dielectric material layer 38 is composed of a compositionally different gate dielectric material than the first gate dielectric material layer 22. The third gate dielectric material layer 38 may have a thickness within the range mentioned above for the first gate dielectric material layer 22.

The third work function setting layer 40 may be selected from one of the work function metal containing materials mentioned above for the first work function setting layer 24 such that the third work function setting layer 32 provides a same threshold voltage to the third gate structure (38, 40, 42) as the first gate structure (22, 24, 26). Typically, but not necessarily always, the third work function setting layer 40 is compositionally the same as the first work function setting layer 24. In one embodiment, the third work function setting layer 40 may provide a threshold voltage to the third gate structure that is less than 0. In another embodiment, the third work function setting layer 40 may provide a threshold voltage to the third gate structure that is greater than 0.

The third gate electrode layer 42 may include one of the conductive materials mentioned above for the first gate electrode layer 26. In one embodiment, the third gate electrode layer 42 is composed of a same conductive material as the first electrode layer 26. In another embodiment, the third gate electrode layer 40 is composed of a compositionally different conductive material than the first gate electrode layer 26.

The third gate structure (38, 40, 42) can be formed utilizing the technique mentioned above in forming the first gate structure (22, 24, 26). The third patterned ILD material 36 may be removed utilizing an anisotropic etching process such as, for example, a reactive ion etch or a chemical wet etch.

Figure 12:
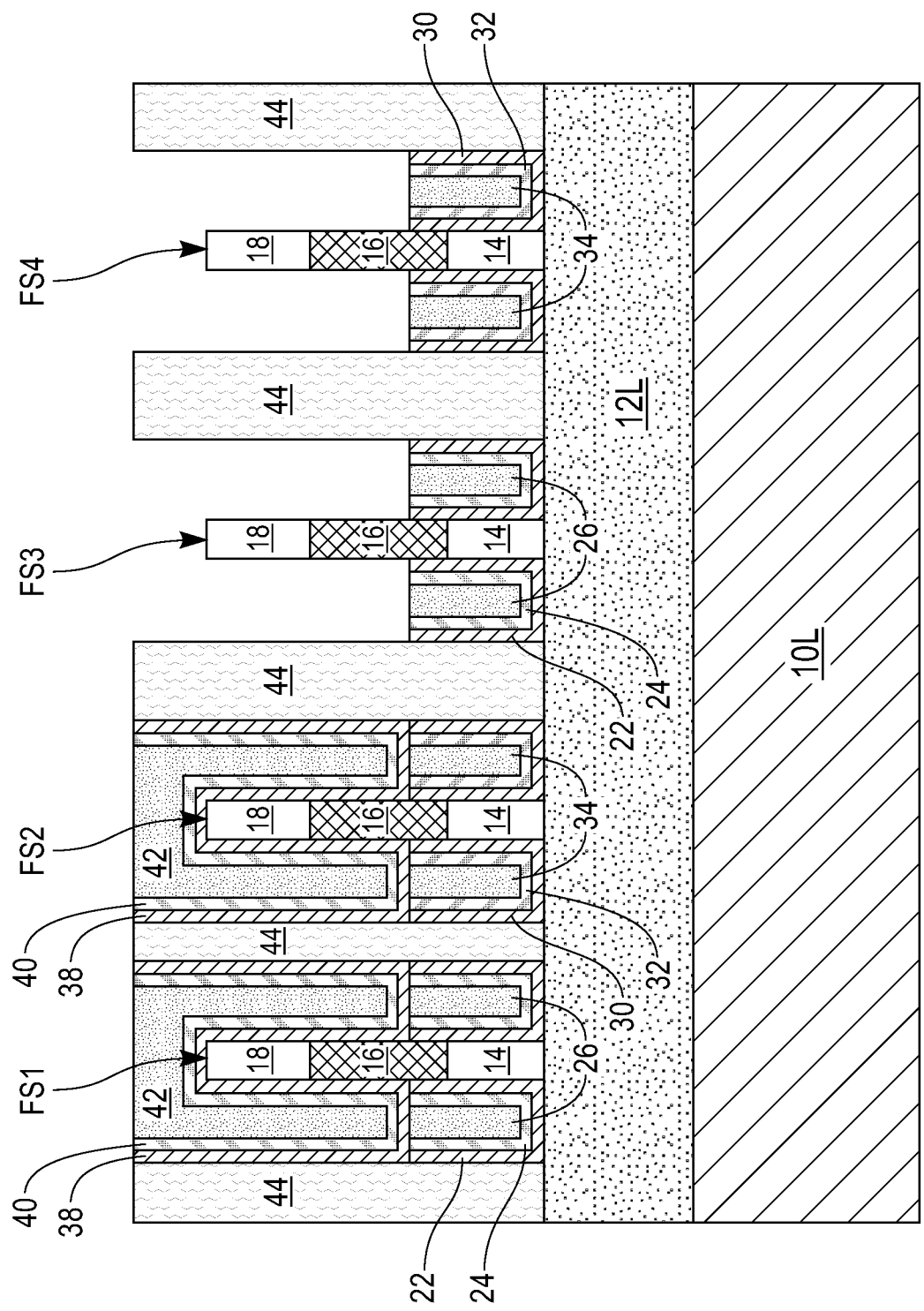
FIG. 12 is a cross sectional view of the exemplary semiconductor structure of FIG. 11 after forming a fourth patterned interlayer dielectric (ILD) material which contains openings which physically expose another fin structure from the first set of fin structures, and another fin structure from the second set of fin structures.

Referring now to FIG. 12, there is illustrated the exemplary semiconductor structure of FIG. 11 after forming a fourth patterned interlayer dielectric (ILD) material 44 which contains openings which physically expose another fin structure (i.e., FS3) from the first set of fin structures, and another fin structure (i.e., FS4) from the second set of fin structures. In one embodiment and as is illustrated in FIG. 12, the third and fourth FS3 and FS4, respectively, are physically exposed, while the first and second fin structures FS1 and FS2, respectively, are protected, i.e., covered, by the fourth patterned ILD material 44.

The fourth patterned ILD material 44 can be formed utilizing the technique mentioned above in forming the first patterned ILD material 20. The fourth patterned ILD material 44 may include one of the dielectric materials mentioned above for the first patterned ILD material 20. In one embodiment, the fourth patterned ILD material 44 is composed of a same dielectric material as that which provides the first patterned ILD material 20. In another embodiment, the dielectric material that provides the fourth patterned ILD material 44 is composed of a compositionally different dielectric material than that which provides the first patterned ILD material 20.

Figure 13:
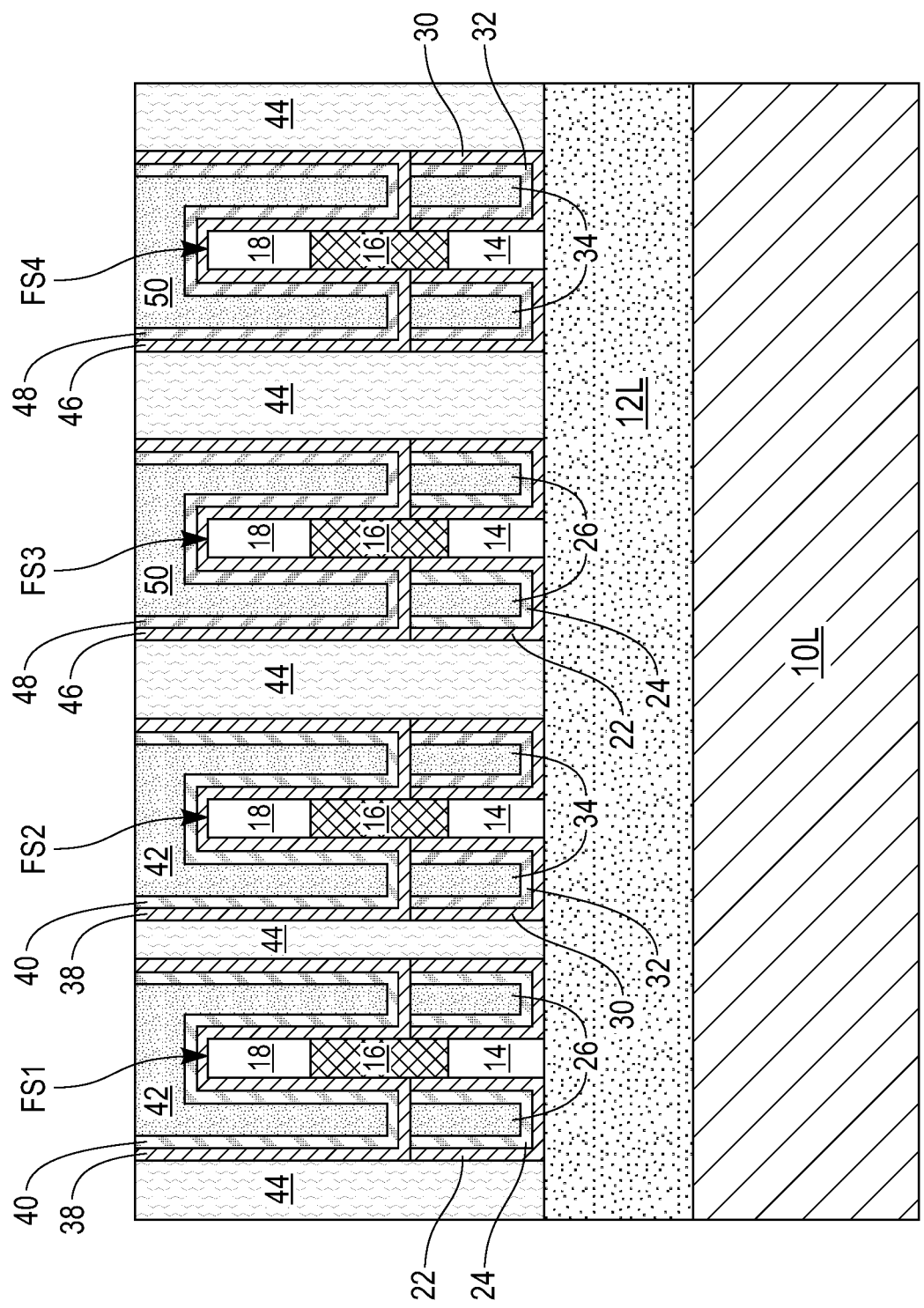
FIG. 13 is a cross sectional view of the exemplary structure of FIG. 12 after forming a fourth gate structure having the second threshold voltage on top of the first gate structure and on physically exposed surfaces of the another fin structure from the first set of fin structures, and on top of the second gate structure and on physically exposed surfaces of the another fin structure from the second set of fin structures.

Referring now to FIG. 13, there is illustrated the exemplary structure of FIG. 12 after forming a fourth gate structure having the second threshold voltage on top of the first gate structure (22, 24, 26) and on physically exposed surfaces of the another fin structure (i.e., FS3) from the first set of fin structures, and on top of the second gate structure (30, 32, 34) and on physically exposed surfaces of the another fin structure (i.e., FS4) from the second set of fin structures. The fourth gate structure includes a fourth gate dielectric material layer 46, a fourth work function setting layer 48, and a fourth gate electrode layer 50.

The fourth gate dielectric material layer 46 may include one of the gate dielectric materials mentioned above for the first gate dielectric material layer 22. In one embodiment, the fourth gate dielectric material layer 46 is composed of a same gate dielectric material as the first gate dielectric material layer 22. In another embodiment, the fourth gate dielectric material layer 46 is composed of a compositionally different gate dielectric material than the first gate dielectric material layer 22. The fourth gate dielectric material layer 46 may have a thickness within the range mentioned above for the first gate dielectric material layer 22.

The fourth work function setting layer 48 may be selected from one of the work function metal containing materials mentioned above for the first work function setting layer 24 such that the fourth function setting layer 48 provides a different threshold voltage to the fourth gate structure (46, 48, 50) as the first gate structure (22, 24, 26), yet the same threshold voltage to the fourth gate structure (46, 48, 50) as the second gate structure (30, 32, 34). Typically, but not necessarily always, the fourth work setting layer is compositionally the same as the second work function setting layer 32. In one embodiment, the fourth work function setting layer 48 may provide a threshold voltage to the fourth gate structure that is less than 0. In another embodiment, the fourth work function setting layer 48 may provide a threshold voltage to the first gate structure that is greater than 0.

The fourth gate electrode layer 50 may include one of the conductive materials mentioned above for the first gate electrode layer 26. In one embodiment, the fourth gate electrode layer 50 is composed of a same conductive material as the first electrode layer 26. In another embodiment, the fourth gate electrode layer 50 is composed of a compositionally different conductive material than the first gate electrode layer 26.

The fourth gate structure (46, 48, 50) can be formed utilizing the technique mentioned above in forming the first gate structure (22, 24, 26).

In one embodiment, the first gate structure (22, 24, 26) programs the first semiconductor fin portion 14 of the first fin structure FS1 as "0", while the third gate structure (38, 40, 42) programs the second semiconductor fin portion 18 of the first fin structure FS1 as "0", the second gate structure (30, 32, 34) programs the first semiconductor fin portion 14 of the second fin structure FS2 as "1", while the third gate structure (38, 40, 42) programs the second semiconductor fin portion 18 of the second fin structure FS2 as "0", the first gate structure (22, 24, 26) programs the first semiconductor fin portion 14 of the third fin structure FS3 as "0", while the fourth gate structure (46, 48, 50) programs the second semiconductor fin portion 18 of the third fin structure FS3 as "1", and the second gate structure (30, 32, 34) programs the first semiconductor fin portion 14 of the fourth fin structure FS4 as "1", while the fourth gate structure (46, 48, 50) programs the second semiconductor fin portion 18 of the fourth fin structure FS4 as "1".

At this point of the present application, a bottom source/drain structure (not shown) can be epitaxially grown from physically exposed surfaces of each first semiconductor fin portion, and a top source/drain structure (not shown) can be epitaxially grown from physically exposed surfaces of each second semiconductor fin portion. The top and bottom source/drain structures are not merged with each other. The top and bottom source/drain structures are composed of a semiconductor material and an n-type dopant or a p-type dopant as are well known to those skilled in the art.

Figure 14:
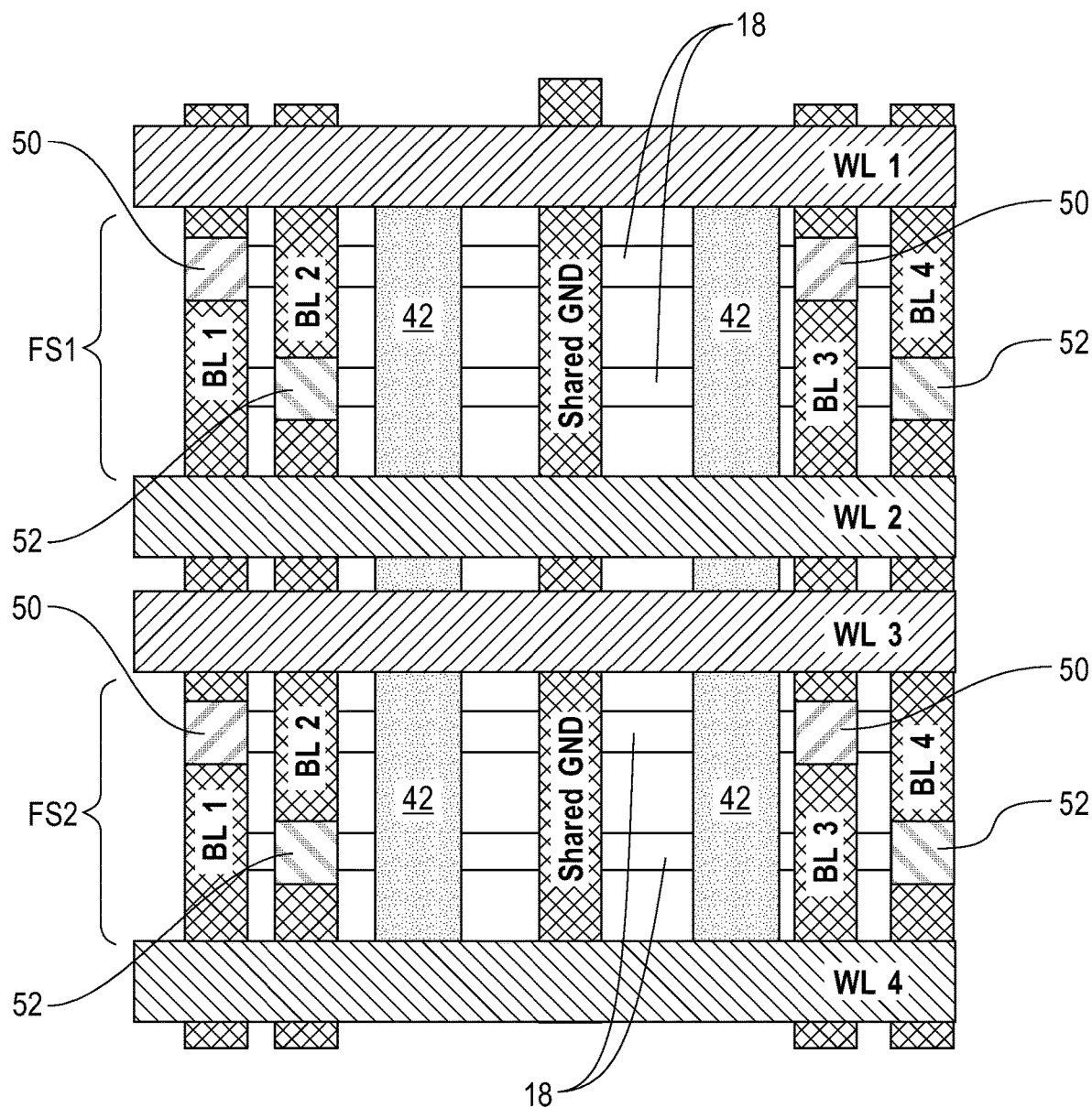
FIG. 14 is a top down view showing an exemplary structure of the present application after contact formation and metallization.

Referring now to FIG. 14, there is illustrated an exemplary structure of the present application after contact formation and metallization. The top-down view illustrated in FIG. 14 only shows a portion of the exemplary structure shown in FIG. 13. For simplicity, the gate dielectric material layers, the work function setting layers and the ILD material are not shown. Contact formation includes forming top source/drain contacts 50 which contact a surface of the top source/drain structure and bottom source/drain contacts 52 which contact a surface of the bottom source/drain structure. The top and bottom contacts 50 and 52 are composed of any well known contact metal or metal alloy and they are formed utilizing techniques that are well known to those skilled in the art. The structure shown in FIG. 14 further includes wordlines, WL 1, WL 2, WL3 and W4, that run perpendicular to each fin structure, and bitlines, BL 1, BL 2, BL3 and BL4, that run parallel to the bitlines and each fin structure. The wordlines and bitlines are composed of conventional conductive materials and can be formed utilizing techniques well known to those skilled in the art. The structure further includes a shared ground (GND), which includes a conventional conductive material and can be formed utilizing techniques well known to those skilled in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A stacked FinFET mask-programmable read only memory (ROM) comprising:
   a fin structure extending upward from an insulator layer, wherein the fin structure comprises, from bottom to top, a first semiconductor fin portion, an insulator fin portion, and a second semiconductor fin portion;
   a lower gate structure having a first threshold voltage and contacting a sidewall of the first semiconductor fin portion; and
   an upper gate structure having a second threshold voltage and contacting a sidewall of the second semiconductor fin portion, wherein the lower gate structure comprises a lower work function setting layer, and the upper gate structure comprises an upper work function setting layer, and wherein the lower work function setting layer is entirely spaced apart from the upper work function setting layer.

2. The stacked FinFET mask-programmable ROM of claim 1, wherein the first and second threshold voltages are the same.

3. The stacked FinFET mask-programmable ROM of claim 2, wherein the first semiconductor fin portion and the second semiconductor fin portion are both programmed as "0".

4. The stacked FinFET mask-programmable ROM of claim 2, wherein the first semiconductor fin portion and the second semiconductor fin portion are both programmed as "1".

5. The stacked FinFET mask-programmable ROM of claim 2, wherein the lower work function setting layer is composed of a compositionally same work function metal containing material as the upper work function setting layer.

6. The stacked FinFET mask-programmable ROM of claim 1, wherein the first and second threshold voltages are different.

7. The stacked FinFET mask-programmable ROM of claim 6, wherein the first semiconductor fin portion is programmed as "0", and the second semiconductor fin portion is programmed as "1".

8. The stacked FinFET mask-programmable ROM of claim 6, wherein the first semiconductor fin portion is programmed as "1", and the second semiconductor fin portion is programmed as "0".

9. The stacked FinFET mask-programmable ROM of claim 6, wherein the lower work function setting layer is composed of a work function metal containing material that is compositionally different from the upper work function setting layer.

10. The stacked FinFET mask-programmable ROM of claim 1, wherein a portion of the lower gate structure contacts a lower portion of a sidewall of the insulator fin portion, and a portion of the upper gate structure contacts an upper portion of the sidewall of the insulator fin portion, and the lower and upper gate structures are in direct physical contact with each other.

11. A stacked FinFET mask-programmable read only memory (ROM) array comprising:
   a first stacked FinFET mask-programmable ROM comprising a first fin structure extending upward from an insulator layer, wherein the first fin structure comprises, from bottom to top, a first semiconductor fin portion, an insulator fin portion, and a second semiconductor fin portion, a lower gate structure having a first threshold voltage contacts a sidewall of the first semiconductor fin portion of the first fin structure, and an upper gate structure having the first threshold voltage contacts a sidewall of the second semiconductor fin portion of the first fin structure;
   a second stacked FinFET mask-programmable ROM comprising a second fin structure extending upward from the insulator layer, wherein the second fin structure comprises, from bottom to top, a first semiconductor fin portion, an insulator fin portion, and a second semiconductor fin portion, a lower gate structure having a second threshold voltage that is different from the first threshold voltage contacts a sidewall of the first semiconductor fin portion of the second fin structure, and an upper second gate structure having the first threshold voltage contacts a sidewall of the second semiconductor fin portion of the second fin structure;

a third stacked FinFET mask-programmable ROM comprising a third fin structure extending upward from the insulator layer, wherein the third fin structure comprises, from bottom to top, a first semiconductor fin portion, an insulator fin portion, and a second semiconductor fin portion, a lower gate structure having the first threshold voltage contacts a sidewall of the first semiconductor fin portion of the third fin structure, and an upper gate structure having the second threshold voltage contacts a sidewall of the second semiconductor fin portion of the third fin structure; and a fourth stacked FinFET mask-programmable ROM comprising a fourth fin structure extending upward from the insulator layer, wherein the fourth fin structure comprises, from bottom to top, a first semiconductor fin portion, an insulator fin portion, and a second semiconductor fin portion, a lower gate structure having the second threshold voltage contacts a sidewall of the first semiconductor fin portion of the fourth fin structure, and an upper gate structure having the second threshold voltage and contacting a sidewall of the second semiconductor fin portion of the fourth fin structure, wherein the lower gate structure of each of the first, second, third and fourth stacked FinFET mask-programmable ROMs comprises a lower work function setting layer, and the upper gate structure of each of the first, second, third and fourth stacked FinFET mask-programmable ROMs comprises an upper work function setting layer, and wherein the lower work function setting layer is entirely spaced apart from the upper work function setting layer.

12. The stacked FinFET mask-programmable ROM of claim 11, wherein the first semiconductor fin portion of the first fin structure is programmed as "0", the second semiconductor fin portion of the first fin portion is programmed as "0", the first semiconductor fin portion of the second fin structure is programmed as "1", the second semiconductor fin portion of the second fin portion is programmed as "0", the first semiconductor fin portion of the third fin structure is programmed as "0", the second semiconductor fin portion of the third fin structure is programmed as "1", the first semiconductor fin portion of the fourth fin structure is programmed as "1", and the second semiconductor fin portion of the fourth fin structure is programmed as "1".

* * * * *